US005768106A

United States Patent [19]

Ichimura

[11] Patent Number: 5,768,106
[45] Date of Patent: Jun. 16, 1998

[54] LAYERED CIRCUIT-BOARD DESIGNING METHOD AND LAYERED CIRCUIT-BOARD

[75] Inventor: Akira Ichimura, Kawasaki, Japan

[73] Assignee: Canon Kabushiki Kaisha, Tokyo, Japan

[21] Appl. No.: 661,473

[22] Filed: Jun. 11, 1996

[30] Foreign Application Priority Data

Jun. 16, 1995 [JP] Japan ............... 7-150680

[51] Int. Cl.$^6$ ...................... H05K 1/14
[52] U.S. Cl. .............. 361/785; 361/778; 361/790; 361/791; 361/792; 361/802; 361/803; 361/809; 439/74; 439/591; 439/44; 439/47; 439/50; 439/65
[58] Field of Search .................... 361/785, 778, 361/790, 791, 792, 802, 803, 809; 439/74, 75, 591, 44, 45, 47, 50, 65

[56] References Cited

U.S. PATENT DOCUMENTS

| 4,133,592 | 1/1979 | Cobaugh et al. | 439/74 |
| 4,134,631 | 1/1979 | Conrad et al. | 439/74 |
| 4,929,185 | 5/1990 | Wong et al. | 439/74 |
| 5,176,526 | 1/1993 | Hillbish et al. | 439/108 |

FOREIGN PATENT DOCUMENTS

3-22597  1/1991  Japan ..................... 439/74

*Primary Examiner*—Leo P. Picard
*Assistant Examiner*—David Foster
*Attorney, Agent, or Firm*—Fitzpatrick, Cella, Harper & Scinto

[57] ABSTRACT

A layered circuit-board designing method and layered circuit-board where circuit-boards to be overlaid are connected at the center or an arbitrary position of each circuit-board. The layered circuit-board includes an upper-layer first circuit-board, a lower-layer third circuit-board, and an intermediate-layer second circuit-board between the first and third circuit-boards. A first connector is mounted on the first circuit-board, a second connector is mounted on the third circuit-board, a third connector is mounted on the top surface of the second circuit-board, while maintaining the positional relation between the third connector and the first connector, and a fourth connector is mounted on the bottom surface of the second circuit-board, while maintaining the positional relation between the fourth connector and the second connector. In addition, through holes are provided at pins of the third and fourth connectors for passing through the front and bottom surfaces of the second circuit-board.

8 Claims, 5 Drawing Sheets

| SIGNAL | PIN No. OF CONNECTOR 12 | PIN No. OF CONNECTOR 13 |
|---|---|---|
| A | ① | ② |
| B | ② | ① |
| C | ⑦ | ⑧ |
| D | ⑧ | ⑦ |

LAYERED CIRCUIT-BOARD DESIGNING METHOD AND LAYERED CIRCUIT-BOARD

BACKGROUND OF THE INVENTION

This invention relates to a layered circuit-board (circuit-board) designing method and layered circuit-board in which, three circuit-boards, for example, are overlaid as an upper circuit-board, an intermediate circuit-board and a lower circuit-board, and these circuit-boards are electrically connected by using a plurality of connectors.

Conventional multiple circuit-boards are laid in layers, and connecting the upper-layer circuit-board and the lower-layer circuit-board. If there is an intermediate-layer circuit-board between the upper-layer circuit-board and the lower-layer circuit-boards, these layer circuit-boards must be connected as shown in FIG. 5.

Figure 5:
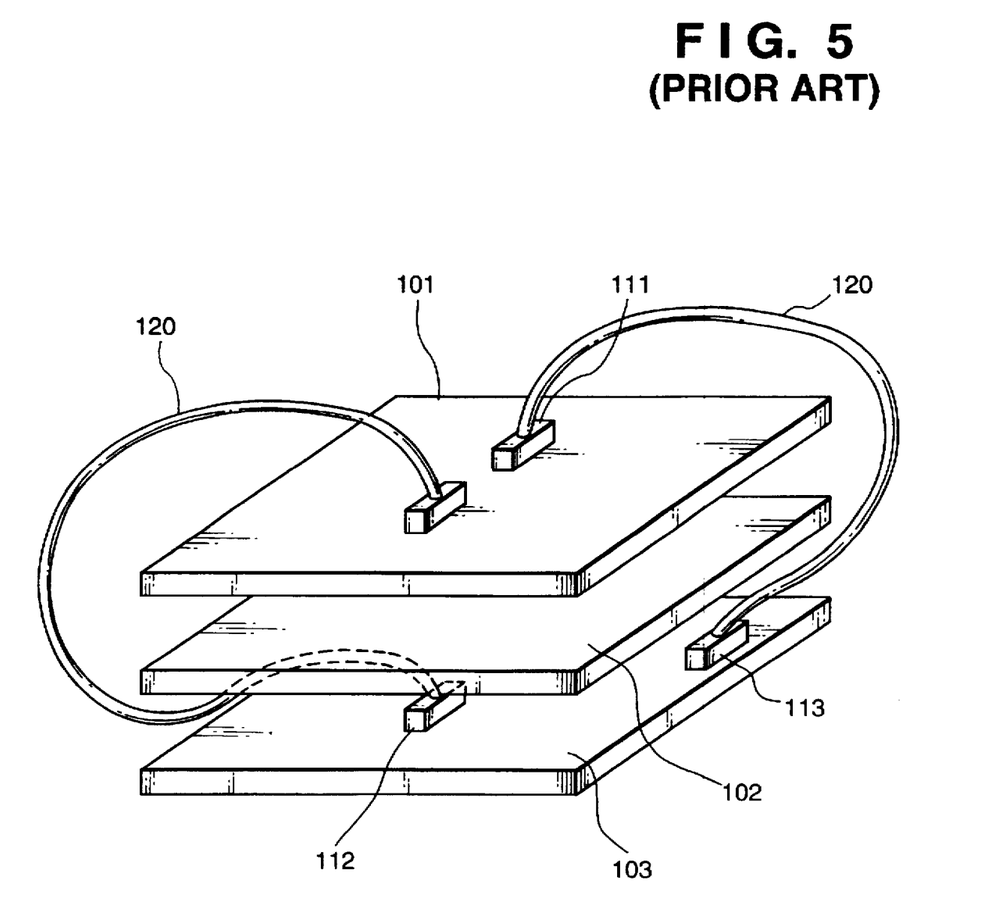
FIG. 5 is a perspective view showing a conventional layered circuit-board.

FIG. 5 is a perspective view illustrating the structure of the conventional layered circuit-board. To provide a circuit-board where three circuit-boards of approximately the same shape are overlaid, as the upper, intermediate and lower circuit-boards, as shown in FIG. 5, the constituents must be prepared as follows. First, an upper-layer circuit-board 101, a lower-layer circuit-board 103 and an intermediate-layer circuit-board 102 are provided, then connectors 111, 112 and 113 are mounted on the respective circuit-boards. The upper-layer circuit-board 101, the intermediate-layer circuit-board 102, and the lower-layer circuit-board 103 are electrically connected by using cables, wire harnesses, and flexible ribbon cables 120.

However, in the conventional art using cables and wire harnesses for connecting the circuit-boards, if there is insufficient space between the respective circuit-boards, it is impossible to connect the circuit-boards at the central position of each circuit-board, thus causing serious constraint on circuit-board designing.

Further, the cables, wire harnesses or flexible substrates, provided so as to pass around the end portions of the circuit-boards, emit radiation noise and function as antennas to receive radiation noise from the outside. This may cause bad influence on signals to be transferred. For this reason, some circuit-boards employ noise-proof special wire material.

SUMMARY OF THE INVENTION

Accordingly, the present invention has been made in consideration of the above situation, and has its object to enable connection of layer circuit-boards, at the central portion or an arbitrary position of each circuit-board, to ensure freedom in circuit-board designing, and to eliminate cables, wire harnesses or flexible substrates, so as to provide a layered circuit-board designing method and layered circuit-board with no bad influence on signals to be transferred.

According to the present invention, the foregoing object is attained by providing a layered circuit-board designing method for overlaying an upper-layer first circuit-board, a lower-layer third circuit-board, and an intermediate-layer second circuit-board existing between the first and third circuit-boards, comprising mounting a first connector on the first circuit-board, mounting a second connector on the third circuit-board, mounting a third connector on the top surface of the second circuit-board, while maintaining the positional relation between the third connector and the first connector, and mounting a fourth connector on the bottom surface of the second circuit-board, while maintaining the positional relation between the fourth connector and the second connector, wherein through-connection means for connecting pins of the third and fourth connectors on the front and bottom surfaces of the second circuit-board is provided.

In accordance with the present invention as described above, the through-connection means is provided at a pin-pitch common to the third and fourth connectors, and is provided at a position where at least pins for signals, to be connected between the third and fourth connectors, are overlapped, and wherein pin arrangement on the third connector and that on the fourth connector correspond with each other.

Further, in accordance with the present invention as described above, the through-connection means is provided at a pin-pitch common to the third and fourth connectors, and is formed as a through hole at a position where at least pins for signals, to be connected between the third and fourth connectors, are overlapped.

Further, in accordance with the present invention as described above, the through-connection means is provided at a pin-pitch common to the third and fourth connectors, and is formed as a through hole at a position where at least pins for signals, to be connected between the third and fourth connectors, are overlapped, and wherein a ground pattern is provided around the through hole.

Further, in accordance with the present invention as described above, the through-connection means is provided at a pin-pitch common to the third and fourth connectors, and the through-connection means guides aligning members formed on the third and fourth connectors to aligning holes formed on the second circuit-board.

Further, in accordance with the present invention as described above, a layered circuit-board formed by overlaying an upper-layer first circuit-board, a lower-layer third circuit-board, and an intermediate-layer second circuit-board existing between the first and third circuit-boards, comprising a first connector mounted on the first circuit-board, a second connector mounted on the third circuit-board, a third connector mounted on the top surface of the second circuit-board, while maintaining the positional relation between the third connector and the first connector, and a fourth connector mounted on the bottom surface of the second circuit-board, while maintaining the positional relation between the fourth. Also provided is the second connector, and through-connection means for connecting pins of the third and fourth connectors on the front and bottom surfaces of the second circuit-board.

Further, in accordance with the present invention as described above, the through-connection means is provided at a pin-pitch common to the third and fourth connectors, and is provided at a position where at least pins for signals, to be connected between the third and fourth connectors, are overlapped, and wherein pin arrangement on the third connector and that on the fourth connector correspond with each other.

Further, in accordance with the present invention as described above, the through-connection means is provided at a pin-pitch common to the third and fourth connectors, and is formed as a through hole at a position where at least pins for signals, to be connected between the third and fourth connectors, are overlapped.

Further, in accordance with the present invention as described above, the through-connection means is provided at pin-pitch common to the third and fourth connectors, and is formed as a through hole at a position where at least pins for signals, to be connected between the third and fourth connectors, are overlapped, and wherein a ground pattern is provided around the through hole.

Further, in accordance with the present invention as described above, the through-connection means is provided at pin-pitch common to the third and fourth connectors, and the through-connection means guides aligning members formed on the third and fourth connectors to aligning holes formed on the second circuit-board.

According to the present invention, the above structure can directly connect signals by connecting the first circuit-board and the third circuit-board by using the connectors. That is, the respective connectors are provided at pin-arrangement positions in accordance with the designing method, which realizes the connection of identical signal pins of the respective connectors, via through holes on lands (circuit pads) for the pins, or through holes at the minimum distance from the pin lands. Further, the structure can avoid superfluity of parts such as boss holes used for connector alignment, by virtue of arrangement of pins where the only signal pins connected via the circuit-board are overlapped.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

As a preferred embodiment of the present invention, an example for connecting two of three circuit-boards via an intermediate circuit-board will be described. In this embodiment, connection is made between two connectors, however, the connection method can also be applied to connection of circuit-board to one connector and to a plurality of connectors.

Figure 1:
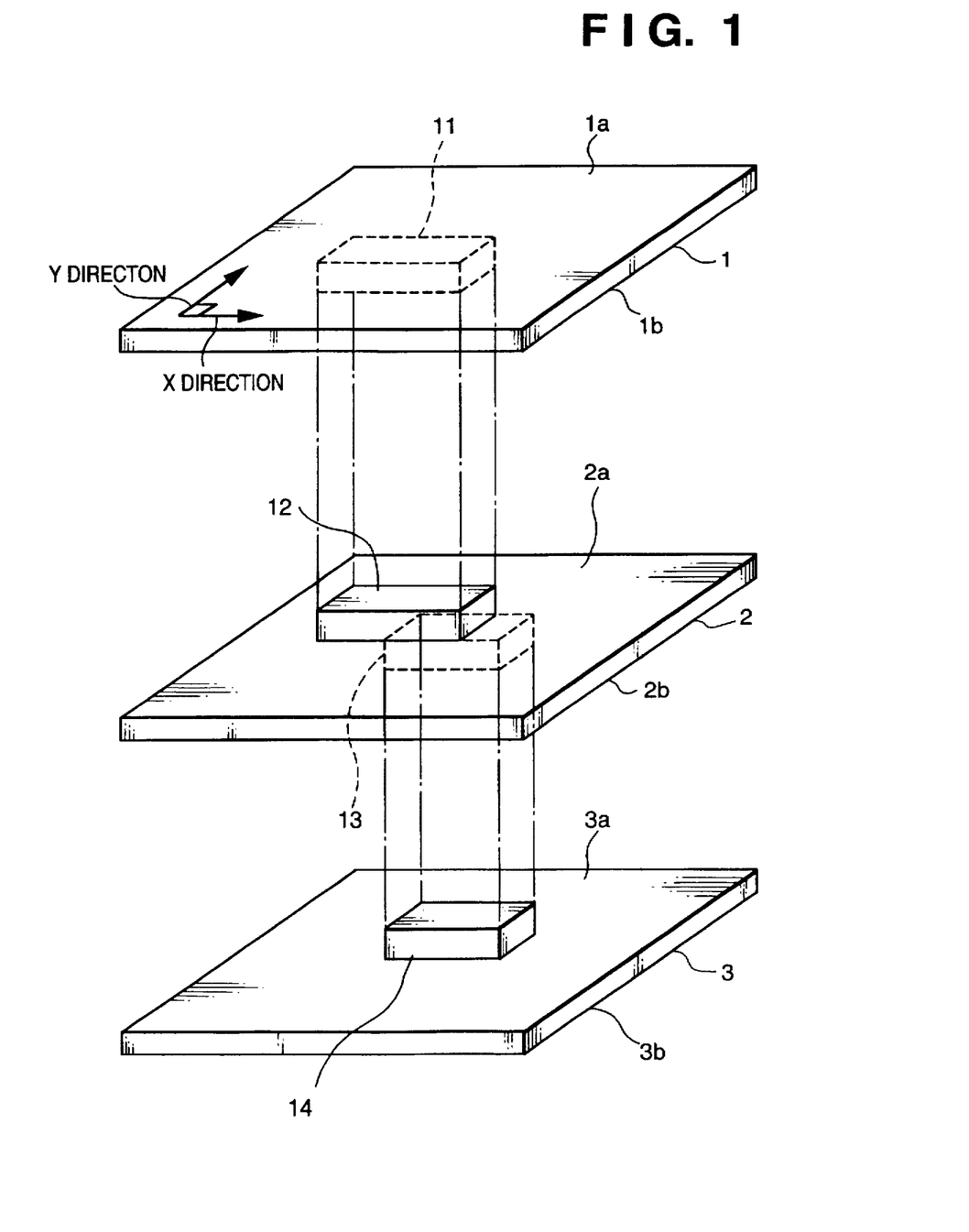
FIG. 1 is a perspective view of an embodiment of the present invention.

FIG. 1 is a perspective view showing a first embodiment of the present invention. This figure shows connection of three circuit-boards, where the upper and lower circuit-boards are connected via the intermediate circuit-board. Specifically, in FIG. 1, an upper-layer circuit-board 1, an intermediate-layer circuit-board 2, and a lower-layer circuit-board 3, having approximately the same size, are overlaid in layers.

To realize this layered structure, a connector 11 represented with a broken line, for signal transfer to the circuit-board 2, is mounted on a bottom surface 1b of the circuit-board 1, and is precisely positioned in both X and Y directions. A connector 12 for signal connection with the circuit-board 1 is mounted on a top surface 2a of the circuit-board 2; a connector 13, represented with a broken line, for signal connection with the circuit-board 3 is mounted on a bottom surface 2b of the circuit-board 2; and a connector 14 for signal connection with the circuit-board 2 is provided on a top surface 3a on the circuit-board 3.

Figure 2:
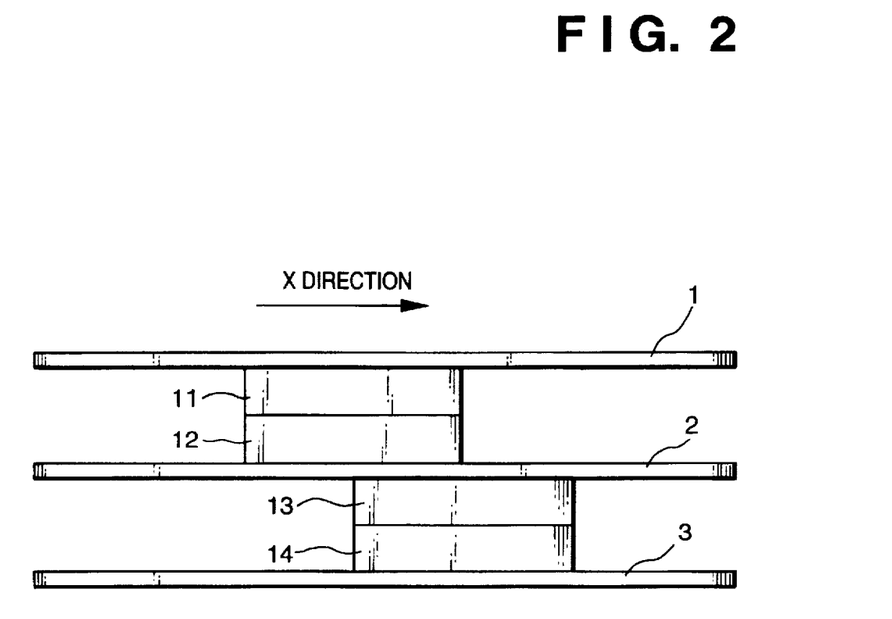
FIG. 2 is a front view illustrating an circuit-boards 1 to 3, after connectors 11 and 12, and connectors 13 and 14 in FIG. 1 have been connected.

As shown in FIG. 2 illustrating connection status, the circuit-boards 1 and 2 connect signals by connection of the connectors 11 and 12. Similarly, the circuit-boards 2 and 3 connect signals by connection of the connectors 13 and 14.

Next, signal transfer in the above structure will be described in a case where four signals A to D of the circuit-board 1 are transferred to the circuit-board 3, by using the connectors 11 to 14 for signal transfer from the circuit-board 1 to the circuit-board 3.

Figure 3A:
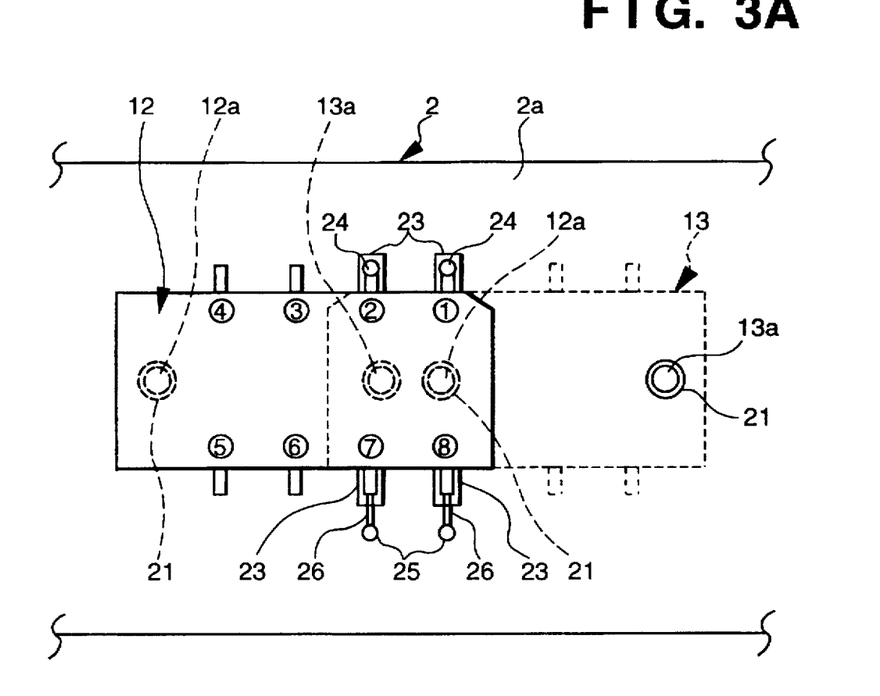
FIG. 3A is an expanded top plan view showing in detail, as a significant-part, the arrangement of the connectors 12 and 13, mounted on the circuit-board 2.
Figure 3B:
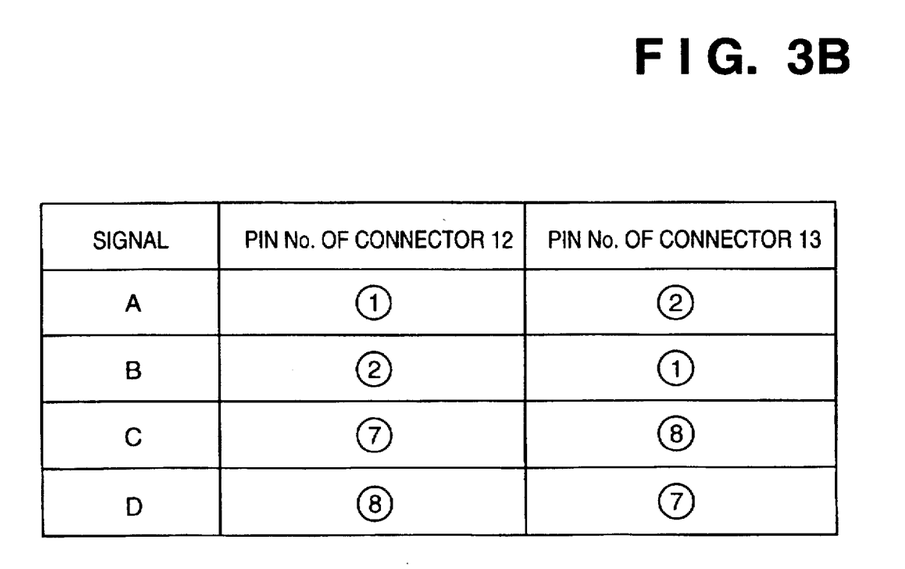
FIG. 3B is a table showing the pin arrangement of the connectors.

FIG. 3A is an expanded top plan view showing a significant part of the circuit-board 2, mainly the connectors 12 and 13. FIG. 3B is a table showing pin numbers of the connectors. As shown in FIG. 3A, the arrangement of the connectors 12 and 13 on the circuit-board 2 is made such that the positions of four pins of the respective circuit-boards are overlapped, when viewed from above the circuit-board 2.

In this pin arrangement where some pin positions are overlapped, the signal arrangement of the connector 12 and that of the connector 13 correspond with each other, when viewed from above the circuit-board 2.

That is, in FIG. 3B, in the arrangement of connector pins in the connectors 12 and 13, a ①pin of the connector 12 and a ②pin of the connector 13 correspond (overlapped). Also, a ②pin of the connector 12 and a ①pin of the connector 13 correspond (overlapped). Then, by providing a through hole 24 at a land 23 for the ②pin of the connector 12, the signal B connects the connectors 12 and 13 with the shortest wiring length, through the through hole 24 which reaches the land for the ①pin of the connector 13 on the bottom surface 2b of the circuit-board 2.

As to the signal A, by providing the through hole 24 at the land 23 for the ①pin of the connector 12, the signal A connects the connectors 12 and 13 with the shortest wiring length through the through hole 24 which reaches the land for the ②pin of the connector 13 on the bottom surface 2b of the circuit-board 2.

Similarly, the signals C and D can connect the connectors 12 and 13 with the shortest wiring length, by using ⑦ pins and ⑧ pins of the connectors.

On the other hand, if a through hole cannot be provided at a land, it may be arranged, as connection of the ⑦pin of the connector 12 and the ⑧ pin of the connector 13, such that a short straight-line wiring pattern 26 is extended from the land 23, and a through hole 25 is provided at the end of the wiring pattern 26, so that the signals C and D can be connected with the short wiring length.

According to the connection as shown in FIG. 3A, the positions of pins for four signals to be transferred to the circuit-boards 1 and 3 are overlapped, this avoids overlapped arrangement of boss holes 21 of the connectors 12 and 13. That is, a pair of boss holes 12a for the alignment of the connector 12 and a pair of boss holes 13a for the alignment of the connector 13 can be shifted in the Y direction, accordingly, the connectors 12 and 13 can be attached while maintaining the overlapped status of the four pins of the connectors.

As described above, the structure of the present embodiment attains direct connection between the connectors at the central portion or an arbitrary position of the connectors. Further, this structure eliminates conventional cables, wire harnesses and the like, which may function as antennas, thus realizes an excellent noise-proof circuit-board with layered structure that has no bad influence on signals to be transferred.

Figure 4:
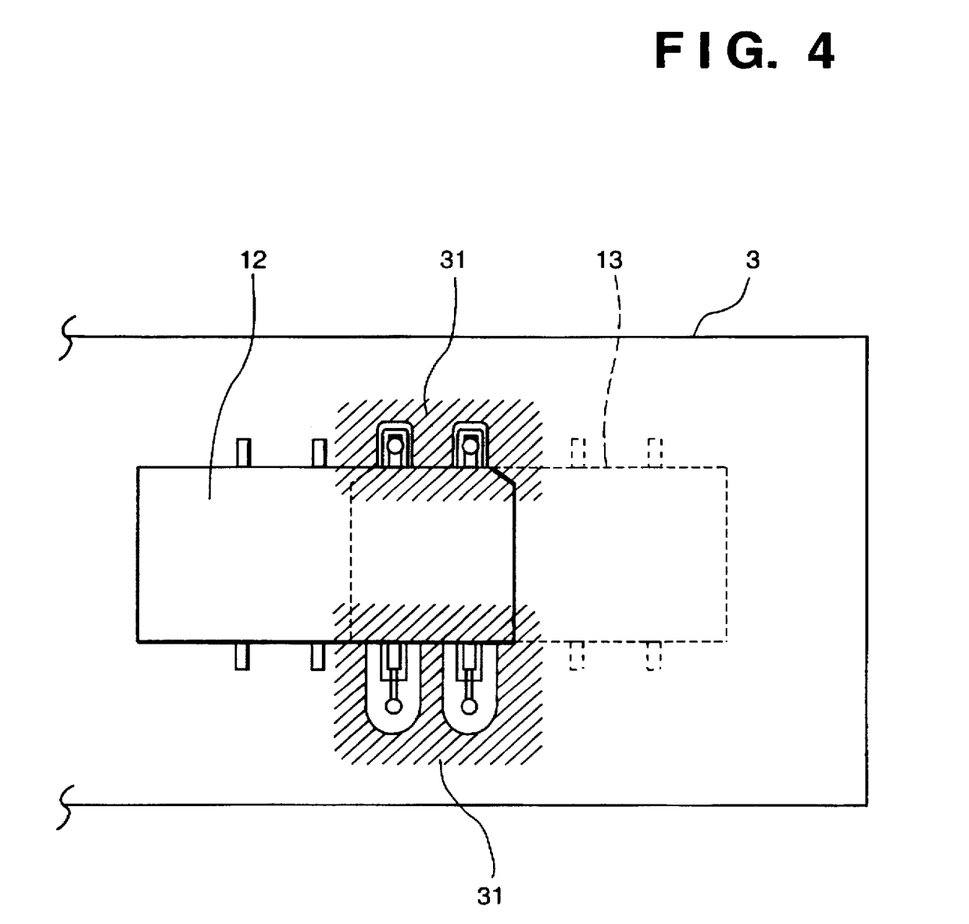
FIG. 4 is an expanded plan view showing, as a significant-part, another embodiment of the present invention.

FIG. 4 is an expanded plan view showing an another embodiment of the present invention, on the assumption that the structure has the same wiring as that in the first embodiment. FIG. 4 shows that the ①, ②, ⑦, and ⑧ pins of the connector 12, and the ②, ①, ⑦, and ⑧ pins of the connector 13, are wired through the through holes. As shown in FIG. 4, the wiring is made within the minimum circuit-board area and the holes are enclosed by a grounded land around the connector pins, i.e., a ground plane 31 as a signal guard pattern. This can maintain signal quality and constraint of radiation noise more effectively.

As described above, in this structure, signals can be directly transferred via connectors without wire harness, and also, circuit-boards can be connected at the central portion of each circuit-board. Thus, the structure simplifies operation in assembling the circuit-board. Since this eliminates cables or harness, the layered circuit-board can be manufactured with lower costs. Further, this structure can avoid reception of radiation noise from such cables and harness functioning as antennas.

Furthermore, this avoids superfluity of boss holes, more than a necessary number for mounting connectors.

Furthermore, the length of wiring from a connector, mounted on the top surface of an circuit-board to a connector mounted on the bottom surface of the circuit-board can be minimized. Therefore, a ground plane can be provided in an empty area around the connectors. This attains more effective signal quality and constraint on radiation noise.

As described above, according to the present invention, in layered circuit-board structure, the connection of the respective circuit-boards can be made at the central portion or an arbitrary position of each circuit-board, and freedom of circuit-board designing can be ensured, without using cables, wire harnesses, flexible substrates and the like that pass around the end portions of the respective circuit-boards. Thus, the present invention can provide a layered circuit-board designing method and layered circuit-board that has no bad influence on signals to be transferred.

The present invention is not limited to the above embodiments and various changes and modifications can be made within the spirit and scope of the present invention. Therefore, to apprise the public of the scope of the present invention, the following claims are made.

What is claimed is:

1. A layered circuitboard designing method for overlaying an upper-layer first circuitboard, a lower-layer third circuitboard, and an intermediate-layer second circuitboard existing between said first and third circuitboards, said method comprising the steps of:

mounting a first connector on said first circuitboard;

mounting a second connector on said third circuitboard;

mounting a third connector on a top surface of said second circuitboard;

mounting a fourth connector on a bottom surface of said second circuitboard;

inserting said first connector into said third connector to electrically connect signals of said first and second circuitboards;

inserting said second connector into said fourth connector to electrically connect signals of said second and third circuitboards; and providing a through-connector on said second circuitboard for connecting pins of said third and fourth connectors on the top and bottom surfaces of said second circuitboard, with said through-connector providing at least one hole for electrically connecting at least one pin of said third connector and at least one pin of said fourth connector.

2. The layered circuitboard designing method according to claim 1, wherein said through-connector is provided at a pin-pitch common to said third and fourth connectors, and is provided at a position where at least pins for signals, to be connected between said third and fourth connectors, are overlapped, and wherein pin arrangement on said third connector and that on said fourth connector correspond with each other.

3. The layered circuitboard designing method according to claim 1, wherein said through-connector has a plurality of through holes are provided at a pin-pitch common to said third and fourth connectors, and formed at positions where at least pins for signals, to be connected between said third and fourth connectors, are overlapped, and wherein a ground pattern is provided around the through holes.

4. The layered circuitboard designing method according to claim 1, wherein said through-connector is provided at a pin-pitch common to said third and fourth connectors and guides aligning members formed on said third and fourth connectors to aligning holes formed on said second circuitboard.

5. A layered circuitboard comprising:

a first circuitboard having a first connector mounted thereon;

a third circuitboard having a second connector mounted thereon;

a second circuitboard having a third connector mounted on a top surface thereof, said third connector electrically connecting signals of said first circuitboard and said second circuitboard by being inserted into said first connector;

a fourth connector mounted on a bottom surface of said second circuitboard, said fourth connector electrically connecting signals of said third circuitboard and said second circuitboard by being inserted into said second connector; and a through-connector on said second circuit board for connecting pins of said third and fourth connectors on said top and bottom surfaces of said second circuitboard, wherein said through-connector includes at least one through hole for electrically connecting at least one pin of said third connector and at least one pin of said fourth connector.

6. The layered circuitboard according to claim 5, wherein said through-connector is provided at a pin-pitch common to said third and fourth connectors, and is provided at a position where at least pins for signals, to be connected between said third and fourth connectors, are overlapped, and wherein pin arrangement on said third connector and that on said fourth connector correspond with each other.

7. The layered circuitboard according to claim 5, wherein said through-connector has a plurality of through hole are provided at a pin-pitch common to said third and fourth connectors, and formed at positions where at least pins for signals, to be connected between said third and fourth connectors, are overlapped, and wherein a ground pattern is provided around the through holes.

8. The layered circuitboard according to claim 5, wherein said through-connector is provided at a pin-pitch common to said third and fourth connectors and guides aligning members formed on said third and fourth connectors to aligning holes formed on said second circuitboard.

* * * * *

UNITED STATES PATENT AND TRADEMARK OFFICE
CERTIFICATE OF CORRECTION

PATENT NO. : 5,768,106
DATED : June 16, 1998
INVENTOR(S) : Ichimura

It is certified that error appears in the above-identified patent and that said Letters Patent is hereby corrected as shown below:

COLUMN 2:

Line 44, "fourth. Also provided is the" should read --fourth connector and the--.
Line 45, "connector, and" should read --connector. Also provided is--.

COLUMN 6:

Line 31, "are" should be deleted.

COLUMN 7:

Line 6, "hole" should read --holes--, and "are" should be deleted.

Signed and Sealed this

Thirty-first Day of August, 1999

Attest:

Q. TODD DICKINSON

*Attesting Officer*     *Acting Commissioner of Patents and Trademarks*